United States Patent [19]
Stout

[11] 4,188,605
[45] Feb. 12, 1980

[54] ENCAPSULATED HALL EFFECT DEVICE

[76] Inventor: Glenn M. Stout, 2000 Argonne Dr., Columbia Heights, Minn. 55421

[21] Appl. No.: 926,658

[22] Filed: Jul. 21, 1978

[51] Int. Cl.² ............................................. H01L 43/04
[52] U.S. Cl. ................................. 338/32 H; 323/94 H
[58] Field of Search ........................... 338/32 H, 32 R; 323/94 H; 324/251, 252; 335/2, 209; 29/592, 613; 400/479.2; 365/170

[56] References Cited

U.S. PATENT DOCUMENTS

| 3,192,471 | 6/1965 | Kuhrt et al. | 324/251 |
| 3,768,095 | 10/1973 | Lins et al. | 338/32 H X |
| 3,845,444 | 10/1974 | Masuda et al. | 338/32 H X |
| 3,845,445 | 10/1974 | Braun et al. | 338/32 H |
| 3,848,252 | 11/1974 | Chang et al. | 338/32 H X |
| 3,858,145 | 12/1974 | Sulich et al. | 338/32 H |
| 3,873,957 | 3/1975 | Würscher et al. | 338/32 H |
| 3,882,337 | 5/1975 | Pfeffer et al. | 338/32 H X |
| 3,898,359 | 8/1975 | Nadkarni | 338/32 H |
| 3,943,481 | 3/1976 | Masuda et al. | 338/32 H X |
| 3,971,958 | 7/1976 | Rogora et al. | 338/32 H X |
| 4,001,755 | 1/1977 | Noren et al. | 338/32 H |
| 4,021,767 | 5/1977 | Nonaka et al. | 338/32 H |
| 4,061,988 | 12/1977 | Lewandowski | 338/32 H |
| 4,066,962 | 1/1978 | Jaffe | 338/32 H X |
| 4,088,977 | 5/1978 | Bowman, Jr. et al. | 338/32 H X |

Primary Examiner—C. L. Albritton
Attorney, Agent, or Firm—Dorsey, Windhorst, Hannaford, Whitney & Halladay

[57] ABSTRACT

An encapsulated Hall effect device is constructed on a thin substrate with an aperture. A semi-conductor chip having a plurality of connection leads and including a Hall effect element having a sensing surface is disposed in registration with the aperture. Encapsulation material surrounds the chip and aperture. The encapsulation material comprises a nonmagnetic portion which surrounds the sensing surface of the chip and a magnetically active portion which surrounds the surface of the chip opposite the sensing surface, with both portions together fully enclosing the chip.

15 Claims, 10 Drawing Figures

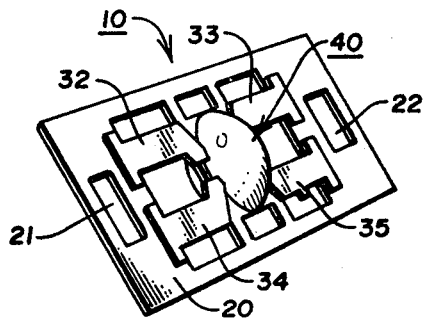
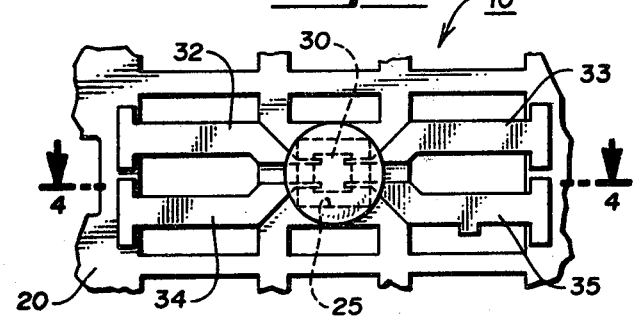
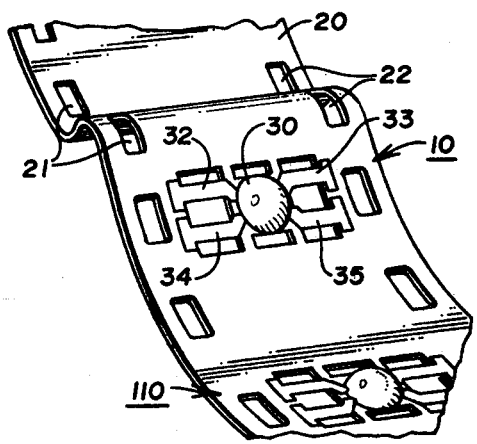
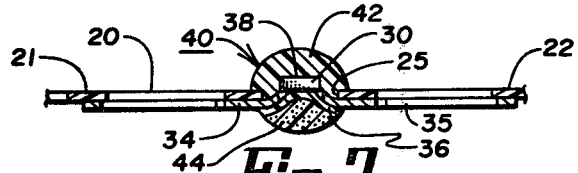
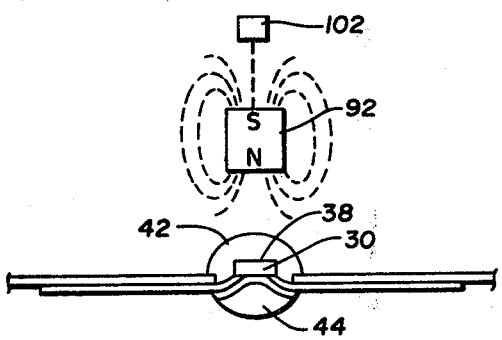
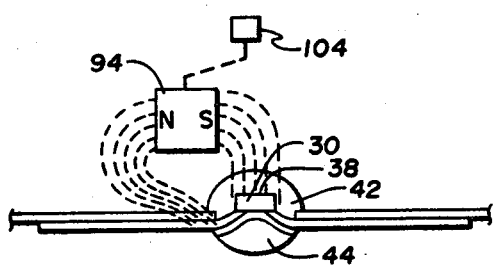
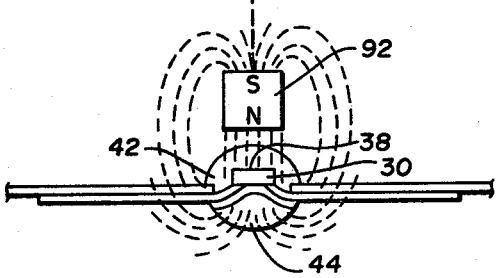
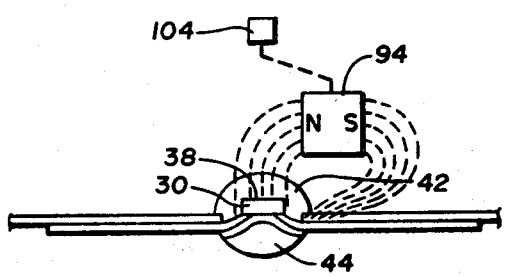
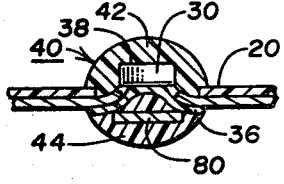
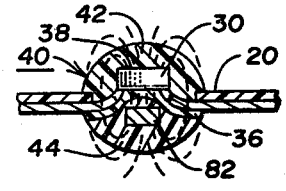

ENCAPSULATED HALL EFFECT DEVICE

BACKGROUND OF THE INVENTION

1. Field of the Invention

This invention relates to Hall effect devices and particularly to an encapsulation structure for packaging Hall effect devices. While not necessarily limited thereto, this invention is contemplated for use with contactless key mechanisms using a solid state switch employing the Hall effect.

2. Description of the Prior Art

Contactless switches for use in keyboards and elsewhere are well-known in the art. One type of contactless switch utilizes a Hall effect device. In such switches, a magnetic activator, typically one or more permanent magnets, is designed to be moved relative to a Hall effect magnetic field sensing element to induce an output signal from the Hall effect sensing element. Several such switches utilizing the Hall effect are shown in U.S. Pat. Nos. 3,858,145; 3,873,957; 3,882,337; 4,054,861; and 4,061,988.

As seen in these patents, contactless switches employing the Hall effect comprise a variety of different configurations. Most of these involve rather intricate mechanical structures accommodating the Hall effect sensing element and its leads, the magnets which activate the Hall effect element and the magnetic conductor materials which participate in the magnet circuit leading to and from the activation magnets and including the Hall effect sensing element. Accordingly, many of these structures require a relatively large amount of space and their assembly is expensive and time consuming.

One step which has been taken to simplify construction of devices incorporating Hall effect sensing elements is to mount the small semiconductor chips incorporating the sensing elements on long, thin strips, resembling conventional photographic film strips. This mounting scheme offers two kinds of efficiency and economy. First, the bare Hall sensing element semiconductor chip with its leads can be cheaply and quickly given a suitable protective encapsulation and packaging form which leads to convenience in handling the Hall sensing elements from the point of manufacture and/or encapsulation to the place where the sensing elements are incorporated into contactless switches or other applications. Second, handling the large numbers of Hall sensing elements involved in mass production of contactless switch keyboards or other applications is facilitated by incorporating these elements on a long continuous medium which can be easily controlled and metered through automated assembly equipment.

SUMMARY OF THE INVENTION

In accordance with the present invention, an improved construction for the encapsulation of Hall effect sensing elements incorporated on a thin, elongated substrate is disclosed. An encapsulated Hall effect device comprises a thin substrate with an aperture; a semiconductor chip, having a plurality of connection leads and including a Hall effect element having a sensing surface, said chip being disposed in registration with the aperture; and encapsulation material surrounding the chip and aperture, the encapsulation material comprising a nonmagnetic portion of the encapsulation material surrounding the sensing surface of the chip, and a magnetically active portion of the encapsulation material surrounding the surface of the chip opposite the sensing surface whereby the chip is fully enclosed by the nonmagnetic and magnetically active portions of the encapsulation material.

In general, the advantages of the present invention derive from improved magnetic circuit design in an encapsulated Hall effect sensing element. By using magnetically active materials as part of the encapsulation, it is possible to focus the magnetic field to achieve higher magnetic field strengths at the sensing surface of the Hall element for an activation magnet of a given strength. At the same time, the perpendicular direction of the magnetic field through the Hall sensing element can be assured. Both of these effects can be obtained in device configurations where the activation magnet is only on one side of the magnetic field sensing surface of the Hall element. With the present invention it is also possible to subject the Hall element to a weak biasing field to reduce its susceptibility to unintended activation by spurious magnetic fields.

It is an object of the present invention to provide an improved Hall effect sensing element encapsulation structure which is able to overcome the disadvantages of the prior art.

It is also an object of this invention to provide a Hall effect device which can be conveniently and economically used to construct a contactless switch mechanism for a keyboard input device.

It is a further object of this invention to provide an encapsulated magnetic circuit structure incorporating a Hall effect sensing element which is adapted for manufacture in long, continuous strips of such structures.

It is an additional object of the present invention to provide an improved magnetic circuit structure for a Hall effect switching device with greater resistance to spurious magnetic fields.

These and other objects of the invention will become apparent from a study of the following description of the preferred embodiments, including the accompanying figures.

BRIEF DESCRIPTION OF THE DRAWINGS

FIG. 1 is a perspective drawing, looking at the underside of a single unit incorporating the encapsulation structure of the present invention.

FIG. 2 is a pictorial drawing from below of a continuous strip containing a plurality of the units as shown in FIG. 1.

FIG. 3 is a bottom plan view of a single unit taken from the strip shown in FIG. 2 incorporating the present invention, with the Hall effect sensing element and its leads shown in hidden lines.

FIG. 4 is a section taken along the line 4—4 in FIG. 3.

FIG. 5 is a detail of the section view as in FIG. 4, showing an alternate embodiment of the invention incorporating a piece of magnetic conductor material.

FIG. 6 is a detail of the section view as in FIG. 4, showing an alternate embodiment of the invention incorporating a bias magnet.

FIG. 7 is a section view as in FIG. 4 (with additional elements shown schematically) showing the invention used in combination with a permanent magnet to form a unipolar switching device, here shown in the "off" position.

FIG. 8 is a section view as in FIG. 7 showing the switching device in the "on" position.

FIG. 9 is a section view as in FIG. 4 (with additional elements shown schematically) showing a bipolar switching device incorporating the present invention and activated by a magnet, here shown in the "off" position.

FIG. 10 is a section view as in FIG. 9 showing the switching device in the "on" position.

DETAILED DESCRIPTION OF THE PREFERRED EMBODIMENT

As best seen in FIGS. 1–4, the present invention concerns an encapsulation structure for a Hall effect sensing element. FIGS. 1 and 3 show a single unit 10 constructed according to the present invention. FIG. 2 shows a portion of a continuous strip containing a plurality of such units, e.g., 10, 110. In the following, only a single unit 10 will be discussed, although it will be clear that the structure of this single unit 10 can be replicated virtually indefinitely on strips such as that shown in FIG. 2.

Referring to FIGS. 1, 3 and 4, the basic structure of the invention in the preferred embodiment can be seen. Each unit is constructed on a thin substrate 20, preferably a flexible plastic film carrier strip, having at intervals along its edges paired openings 21, 22, suitable for receiving gear teeth, used for holding and driving the continuous strip 20 for automated mass production. Midway between the two edges of the substrate 20 is a square aperture 24. A Hall effect sensing element in the form of a semiconductor chip 30 is located in registration with this aperture 25. Connection leads 32, 33, 34, 35 extend outwardly from the chip 30 and lie flat against one surface of the substrate 20. The particular type of semiconductor chip 30 used can vary according to the specific application. In some cases it may be desirable to use a chip 30 incorporating no more than a Hall effect sensor (generator) without additional circuitry; for other applications an integrated circuit chip including various additional circuitry, such as a voltage regulator, a Schmitt trigger circuit and an output amplifier, may be desired. One such integrated circuit which has been found satisfactory for the present application is the ULN-3000 series of Hall effect circuits manufactured by Sprague Electric Company. Typically, the connecting leads 32, 33, 34, 35 near the chip 30 are covered with a thin layer of insulating material 36 placed on them by the chip manufacturer. It is also usual that one surface of the chip 30 is preferred as the surface to be approached by the pole of any activation magnet and can be labeled the sensing surface 38.

As best seen in FIGS. 3 and 4, the chip 30 and the adjacent portions of the connecting leads 32, 33, 34, 35 are surrounded by a droplet-shaped mass 40 of encapsulation material, consisting, in the preferred embodiment, of two portions. The first or upper portion 42 located adjacent the sensing surface 38 of the chip 30 comprises a nonmagnetic or magnetically transparent material such as rubber, lacquer, thermo-setting polymers, or, preferably, an epoxy resin. The second or lower portion 44 of the encapsulation mass 40, on the other hand, incorporates magnetically active material, and is, therefore, not magnetically transparent.

Three different embodiments, each incorporating a somewhat different type of magnetically active material in the lower portion 44 of the encapsulation mass 40, are disclosed. In one embodiment, the encapsulation material of the lower portion 44 comprises a mixture of a binder and powdered soft iron, powdered iron oxide, powdered high-nickel alloy (such as that sold under the trademark PERMALLOY) or some other finely divided material having a significant magnetic permeability and which can serve as a magnetic conductor. Suitable binders are the same rubber, lacquer, thermo-setting polymers or epoxy resin materials used to form the upper portion 42 of the encapsulation mass 40. Due to the presence of the powdered magnetically permeable material, the lower portion 44, as a whole, will have a certain magnetic permeability (or low magnetic reluctance), which may be designed to fit a particular application by using various concentrations of the finely divided materials relative to the binder and by selecting a finely divided material with a higher or lower permeability. A typical formulation which has been found suitable in one contactless switch application is a mixture of powdered iron and epoxy resin in a ratio of 50% by volume of iron to epoxy resin.

In a second embodiment illustrated in FIG. 5, the lower portion 44 of the encapsulation mass 40 incorporates a small piece of magnetic conductor 80, e.g., a piece of magnetically permeable material such as soft iron. The shape, size and magnetic characteristics of the piece of magnetic conductor material 80 may vary according to the application. In a typical contactless switch application a soft iron plate or disc having a width or diameter of 3 mm (significantly larger than the width of the chip 30) and a thickness of approximately 0.5 mm would be appropriate. The piece of magnetic conductor 80 is disposed adjacent the connector leads 32, 33, 34, 35 and is held in place by the epoxy resin (or other encapsulation material) forming the lower portion 44 of the encapsulation mass 40.

In a third embodiment, illustrated in FIG. 6, the material forming the lower portion 44 of the encapsulation mass 40 incorporates a small piece of permanent magnet material 82. As in the previous embodiment the shape, size and magnetic characteristics of the piece of magnetically active material incorporated in the lower portion 44 of the encapsulation mass 40, may vary according to the application. Of importance in this embodiment is the orientation of the permanent magnet material 82, because its purpose is to subject the Hall effect chip 30 to a weak magnetic field, thereby biasing the chip 30 in an "on" or "off" sense depending on the orientation of other magnetic fields to which the chip 30 is exposed. In general, the permanent magnet 82 will be oriented so that its magnetic field at the sensing surface 38 is substantially perpendicular to the sensing surface 38 of the chip 30 and substantially parallel to any field used to activate the chip 30. In a typical unipolar switch application, when the bias magnet field and activation magnet field are parallel but opposing in direction, the bias magnet 82 biases the switch in an "off" position.

The method of manufacturing each of the above embodiments is substantially the same. The upper portion 42 and the lower portion 44 of the encapsulation mass 40 are both applied in liquid form. After application, each portion 42, 44 is allowed or induced to harden according to whether the material is thermosetting or will set up with normal temperatures. The substrate 20 with the chip 30 held in place by any suitable means is oriented first with one side up, then with the other side up so that the upper and lower portions 42, 44 each can be applied by means of a downwardly directed drop of encapsulation material. For those embodiments requiring the incorporation of a small piece of magnetically active material 80, 82 (see above discussion of FIGS. 5 and 6) into the second or lower portion 44, this piece is placed adjacent the chip 30 before the drop of material is applied. In such cases, the insulation layer 36 prevents direct contact of the piece of magnetically active material 80, 82 with the chip 30 or its leads 32, 33, 34, 35. If necessary, to avoid potential short circuits resulting from a low ohmic resistance in the lower portion 44 of the encapsulation material 40, the insulation layer 36 can be supplemented before application of the lower portion 44.

For many applications, including contactless switches, the Hall effect sensing element of the present invention is installed on a printed circuit board. In a typical case this installation is effected by using a stamping die to cut the encapsulated Hall effect sensing element and all or a portion of its connecting leads 32, 33, 34, 35 out of the segment of the substrate 20 in which these are mounted. The cut-out piece is then placed in position on a printed circuit board (not shown) with the sensing surface 38 away from the printed circuit board and the connection leads 32, 33, 34, 35 adjacent the printed circuit board, such that the appropriate electrical connections can be made, for example, by a solder connection between the connection leads 32, 33, 34, 35 and exposed metal foil portions (not shown) of the printed circuit board. If necessary, the leads 32, 33, 34, 35 can be bent or flexed so as to improve contact with the printed circuit board when the lower encapsulation mass 44 is large.

The various embodiments of the present invention function as follows in the presence of external magnetic fields, as shown generally in FIGS. 7-10. When no magnetic fields are present with a component perpendicular to the sensing surface 38 of the Hall effect chip 30, the Hall effect voltage in the device is zero and an output signal from the chip 30 corresponding to this state will be present. When a permanent magnet or other source of magnetic field (e.g., magnet 92 in FIGS. 7 and 8) approaches the Hall effect chip 30 and subjects the sensing surface 38 to a magnetic field having a component perpendicular to the sensing surface 38, a Hall effect voltage is produced, with polarity in accordance with the laws for this phenomenon, and an output signal corresponding to this new state will be observed. Because the upper portion 42 of the encapsulation mass 40 is made of nonmagnetic material, it is transparent to the magnetic fields to which the chip 30 is exposed. The magnetically active lower portion 44 of the encapsulation mass 40, on the other hand, comprises magnetically active material and will have an influence on the response of the chip 30 to external magnetic fields. In particular, in the embodiment of the invention having powdered magnetic material incorporated in the lower portion 44 of the encapsulation mass 40 (FIG. 4), the lower portion 44 acts as a concentrator for any adjacent magnetic fields, thereby causing the sensing surface 38 of the Hall effect chip 30 to be exposed to a higher magnetic field density than is present without field concentrating means. In effect, the lower portion 44 forms one segment of a magnetic circuit running from one pole of the magnetic field source (e.g., one surface of permanent magnet 92 in FIGS. 7 and 8), through the nonmagnetic upper portion 42, through the Hall effect chip 30 and the magnetically active lower portion 44 and back to the other pole of the magnetic field source. The benefit of this more concentrated field is that a more distinct switching effect in the Hall effect chip 30 can be obtained for a magnetic field source of a given strength. Conversely, a weaker magnetic field source aided by a field concentrator can induce the same switching effect as a larger magnetic field source without a concentrator. The availability of an abundance of magnetic flux through the Hall effect chip improves reliability and reduces operating variations between production run Hall effect devices.

A similar magnetic circuit exists in the case of the second embodiment of the invention (FIG. 5), incorporating the small piece 80 of high permeability magnetic material embedded in the lower portion 44 of the encapsulation mass. Here also the magnetic field density to which the Hall effect chip 30 is exposed is increased by a concentration effect, with benefits as with the preceding embodiment.

In the third embodiment of the invention (FIG. 6), using a small bias magnet 82 embedded in the lower portion 44 of the encapsulation material 40, a slightly different mode of operation exists. The presence of the small magnet 82 causes a weak magnetic field to pass through the Hall effect chip 30. This field follows a low permeability magnetic circuit including the air, upper and lower portions 42, 44 of the encapsulation mass 40 and the Hall effect chip 30. The weak magnetic field is sufficient to cause a slight Hall effect voltage. This voltage corresponds to biasing the Hall effect chip 30 in either the "on" or "off" position depending on the relative orientations of the bias magnet 82 and the activation magnet and the logic of the chip 30. Typically, the orientation of the bias magnet 82 will be chosen so that the Hall effect chip 30 is biased "off," to reduce the possibility of spurious magnetic fields causing an "on" condition. In this case the orientation of the field of the bias magnet 82 opposes the orientation of the activating magnetic field source causing the "on" condition, thereby exerting an influence which counteracts rather than aids the activating magnetic field source.

As shown in FIGS. 7 and 8, the present invention can be used in connection with a permanent magnet 92 linked to an actuation key button 102 (linkage shown symbolically in FIGS. 7 and 8) to form a unipolar contactless switch. As shown in FIG. 8, placing the north pole of the permanent magnet 92 in close proximity to the sensing surface 38 of the Hall effect chip 30 results in a magnetic circuit which includes the magnetically active lower portion 44 of the encapsulation material 40. In a typical application this situation would correspond to the "on" position of the unipolar switch. In the "off" position, on the other hand, as shown in FIG. 7, the encapsulated chip 30 is not exposed to any significant magnetic fields because the magnet 92 is far enough removed from the chip 30 that any magnetic fields near the sensing surface 38 are of negligible strength. If it is desired to use a bias magnet 82 (FIG. 6) with such a unipolar switch, the bias magnet 82 would have its north pole face the north pole of activation magnet 92. Upon approaching the chip 30, the field of the activation magnet 92 would overcome the field of the smaller bias magnet 82 to cause the desired change in switching states. Use of a lower encapsulation portion 44 containing magnetically permeable materials but no bias magnet (FIGS. 4, 5) would lead to greater concentration of the magnetic field of the activation magnet 92 at the sensing surface 38.

As shown in FIGS. 9 and 10, the present invention can also be used for a bipolar contactless switch by using two different activation magnets with opposite orientations or, in the preferred embodiment, a single magnet 94 linked to an actuation key button 104 (linkage shown symbolically in FIGS. 9 and 10) which moves laterally from one side of the chip 30 to the other and changes its orientation by one-hundred eighty degrees. With a bipolar switch, the presence of a magnetic field of one sense at the sensing surface 38 is defined as the "on" position while the presence of a field of the opposite sense is defined as the "off" position. The field concentration effect resulting from the use of magnetically permeable materials in the lower encapsulation portion 44 (FIGS. 4 and 5) enhances the fields in both the "on" and "off" positions. If a bias magnet 82 is used, it augments the fields present for one of the switching states and works against the fields for the other state.

The description of the preferred embodiments herein is quite specific. Those skilled in the art will perceive modifications which can be made in these specific embodiments without departing from the spirit of the invention. Accordingly, it is intended by the appended claims to cover all such embodiments as fall within the true spirit and scope of the invention.

I claim:

1. An encapsulated Hall effect device comprising:
   a thin substrate with an aperture;
   a semiconductor chip, having a plurality of connection leads and including a Hall effect element having a sensing surface, said chip being disposed in registration with the aperture; and
   encapsulation material surrounding the chip and aperture, the encapsulation material comprising:
      a nonmagnetic portion of the encapsulation material surrounding the sensing surface of the chip, and
      a magnetically active portion of the encapsulation material surrounding the surface of the chip opposite the sensing surface, said magnetically active portion of the encapsulation material comprising a mixture of a finely divided magnetic conductor material and a binder,
   whereby the chip is fully enclosed by the nonmagnetic and magnetically active portions of the encapsulation material.

2. The encapsulated Hall effect device recited in claim 1 wherein the finely divided magnetic conductor material is a material selected from the group consisting of powdered soft iron, powdered iron oxides and powdered Permalloy Alloy.

3. The encapsulated Hall effect device recited in claim 1 wherein the binder is a material selected from the group consisting of rubber, lacquer, epoxy resin and thermosetting polymers.

4. The encapsulated Hall effect device recited in claim 1 wherein the magnetically active portion of the encapsulation material comprises a mixture of epoxy resin and powdered soft iron.

5. An encapsulated Hall effect device comprising:
   a thin substrate with an aperture;
   a semiconductor chip, having a plurality of connection leads and including a Hall effect element having a sensing surface, said chip being disposed in registration with the aperture; and
   encapsulation material surrounding the chip and aperture, the encapsulation material comprising:
      a nonmagnetic portion of the encapsulation material surrounding the sensing surface of the chip, and
      a magnetically active portion of the encapsulation material surrounding the surface of the chip opposite the sensing surface, said magnetically active portion of the encapsulation material comprising a bias magnet of permanent magnet material covered with a binder, whereby the chip is fully enclosed by the nonmagnetic and magnetically active portions of the encapsulation material.

6. The encapsulated Hall effect device recited in claim 1 wherein the substrate is an elongated strip of plastic film bearing a plurality of other encapsulated Hall effect devices.

7. An encapsulated Hall effect device comprising:
   a thin substrate with an aperture;
   a semiconductor chip, having a plurality of connection leads and including a Hall effect element having a sensing surface, said chip being disposed in registration with the aperture; and
   encapsulation material surrounding the chip and aperture, the encapsulation material comprising:
      a nonmagnetic portion of the encapsulation material surrounding the sensing surface of the chip, and
      a magnetically active portion of the encapsulation material surrounding the surface of the chip opposite the sensing surface, said magnetically active portion of the encapsulation material comprising a planar piece of magnetic conductor covered with a binder material,
   whereby the chip is fully enclosed by the nonmagnetic and magnetically active portions of the encapsulation material.

8. The encapsulated Hall effect device recited in claim 7 wherein the planar piece of magnetic conductor is a soft iron plate.

9. A magnetically activated contactless switch comprising: an encapsulated Hall effect device, including
   a thin substrate;
   a semiconductor chip, having a plurality of connection leads and including a Hall effect element having a first, sensing surface and a second surface opposite said sensing surface and substantially parallel thereto, said chip being affixed to said substrate and disposed such that the plane of the sensing surface lies substantially parallel to the plane of the substrate;
   encapsulation material surrounding the sensing surface of the chip, said encapsulation material being substantially transparent to magnetic fields; and
   a body of magnetically active material disposed in close proximity to the second surface of the chip and in substantially axial alignment with said sensing surface such that the plane of said second surface lies between said body and said sensing surface; and
   a magnetic field source for activating said Hall effect device, said source being movable between a first, "on," position and a second, "off," position, said source and both of said positions being located on the same side of the plane of the sensing surface, opposite the location of said magnetically active body, and at lease one of said first and second positions being adjacent said sensing surface, whereby the magnetic flux from the magnetic field source when positioned adjacent said sensing surface follows a magnetic circuit passing through said sensing surface and said second surface and through said magnetically active body, said magnetic field source and said magnetically active body being the only magnetically active materials in the magnetic circuit.

10. The contactless switch recited in claim 9 wherein the magnetically active body comprises a mixture of a finely divided magnetic conductor material and a binder.

11. The contactless switch recited in claim 10 wherein the finely divided magnetic conductor material is a material selected from the group consisting of powdered soft iron, powdered iron oxides and powdered Permalloy Alloy.

12. The contactless switch recited in claim 10 wherein the binder is a material selected from the group consisting of rubber, lacquer, epoxy resin and thermosetting polymers.

13. The contactless switch recited in claim 10 wherein the magnetically active body comprises a mixture of epoxy resin and powdered soft iron.

14. The contactless switch recited in claim 9 wherein the magnetically active body comprises a bias magnet of permanent magnet material covered with a binder.

15. The contactless switch recited in claim 9 wherein the magnetically active body comprises a planar piece of magnetic conductor covered with a binder material.

* * * * *